METHOD OF MANUFACTURING SEMICONDUCTOR DEVICES

Filed Sept. 30, 1969 3 Sheets-Sheet 1

METHOD OF MANUFACTURING SEMICONDUCTOR DEVICES

Filed Sept. 30, 1969 3 Sheets-Sheet 3

United States Patent Office 3,745,070

Patented July 10, 1973

3,745,070

METHOD OF MANUFACTURING SEMICONDUCTOR DEVICES

Kazuo Yada, Tokyo, Yamichi Ohmura, Sagamihara-shi, Hideharu Egawa, Tokyo, and Saburo Fukasaku, Kawasaki-shi, Japan, assignors to Tokyo Shibaura Electric Co., Ltd., Kawasaki-shi, Japan Filed Sept. 30, 1969, Ser. No. 862,438
Claims priority, application Japan, Oct. 4, 1968, 43/71,852
Int. Cl. H01l 7/54
U.S. Cl. 148—1.5 13 Claims

ABSTRACT OF THE DISCLOSURE

Semiconductor devices are manufactured by forming at least one implanted layer on the surface of a semiconductor substrate by implanting an active impurity thereinto and annealing the substrate in an oxidizing atmosphere at a temperature ranging from 900° C. to 1300° C. to form an oxide layer on said implanted layer and to diffuse the impurity in the implanted layer into deeper portions of the substrate to form a junction at said deeper portions.

This invention relates to a method of manufacturing semiconductor devices and more particularly to a method of manufacturing semiconductor devices including junctions by the ion-implantation method.

As a method of forming an independent layer in a semiconductor substrate to form a junction therebetween, for example, a PN-junction, a $PP^+$-junction, $NN^+$-junction, or an IP- or IN-junction, the so-called ion-implantation method has been proposed. According to this method, desired impurities are driven or implanted into a semiconductor substrate in the form of accelerated ions and the substrate is annealed during or after the ion-implantation operation to activate the impurities which have been driven in the form of ions and to anneal and reorder disordered crystals in the upper layer of the semiconductor substrate caused by ions driven thereinto. Since, according to this method impurities are forcibly implanted into the substrate any one of many well known materials can be utilized as the substrate and/or impurity. This method also results in abrupt junctions so that the method is now widely used in many applications. According to this method, however, it is only possible to form relatively shallow junctions in the substrates. For example, when a PN-junction is formed by this method, the depth of the junction is at most only two microns. For this reason, application of semiconductor devices fabricated by the ion-implantation method has been limited to special cases.

Of course as is well known in the art, it is possible to increase the depth of the junction by increasing the accelerating voltage of ions. However, this method is not advantageous because of a high energy accelerating apparatus required.

It is an object of this invention to provide an improved method of forming deep junctions in substrate by the ion-implantation method without the necessity of utilizing any accelerating apparatus of high energy.

According to this invention there is provided a method of manufacturing a semiconductor device having a deep junction without utilizing any accelerating device of high energy, said method comprising the steps of implanting ions of an active impurity into a semiconductor substrate by the ion-implantation method, annealing the substrate at a temperature ranging from 900° C. to 1300° C., in an oxidizing atmosphere during at least one period of said annealing process to form an oxide film on the portion at which said impurity has been implanted and to diffuse the implanted impurity to deeper portions of the substrate.

This invention can be more fully understood from the following detailed description when taken with reference to the accompanying drawings, in which:

FIGS. 1A and 1B are cross-sections of a semiconductor device illustrating successive steps of the method of this invention, wherein FIG. 1A represents a step of forming an implanted layer in a semiconductor substrate by the ion-implantation method and FIG. 1B a semiconductor substrate after annealing;

FIGS. 4A, 4B and 4C are sectional views showing successive steps of manufacturing a transistor according to this invention, wherein FIG. 4A shows a step of forming a base layer in a semiconductor substrate, FIG. 4B a step of forming an implanted layer in the base layer by the ion-implantation method and FIG. 4C the substrate after annealing;

Figure 6A:
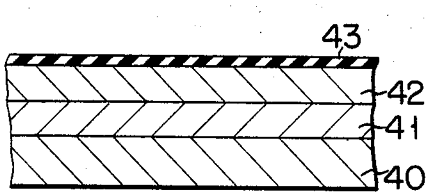
Figure 6B:
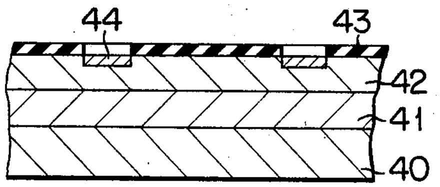
Figure 6C:
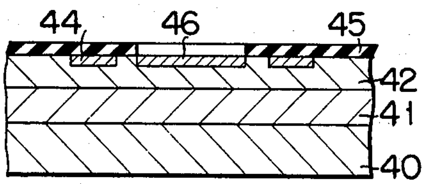
Figure 6D:
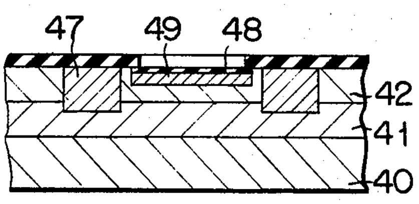

FIGS. 6A to 6D are sectional views illustrating successive steps of fabricating a transistor in accordance with this invention, wherein FIG. 6A shows a semiconductor substrate formed with a base layer, FIG. 6B a step of forming a first implanted layer by the ion-implantation method, FIG. 6C a step of forming a second implanted layer and FIG. 6D the transistor after annealing; and FIGS. 7A to 7D are sectional views similar to FIGS. 6A to 6D illustrating successive steps of fabricating a transistor according to a modified embodiment of this invention.

The outline of this invention will be described by referring to FIGS. 1A and 1B through FIGS. 3A to 3F.

Figure 1A:
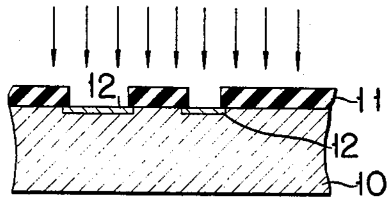
Figure 1B:
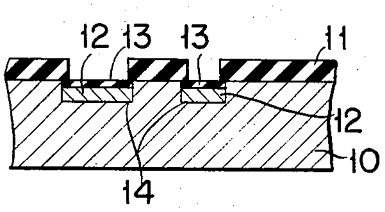

A semiconductor substrate 10 of one conductivity type is prepared and impurity layers 12 are formed in the upper part of the substrate by the ion-implantation method wherein ions of an active impurity are driven or implanted in the upper layer selectively by a mask 11 as shown in FIG. 1A. By considering the concentration distribution of the layer implanted with the impurity which is dependent upon the conditions of implantation such as the ion accelerating voltage, the intensity of the ion current, the quantity of the impurity, and the nature of the impurity and the substrate is annealed within the temperature range of 900° C. to 1300° C., the substrate being exposed to an oxidizing atmosphere during at least one period of said annealing, thereby formed oxide films 13 on the impurity layers 12 and diffused the implanted impurity to deeper layers thus forming deeper junctions 14 as shown in FIG. 1B.

Figure 2:
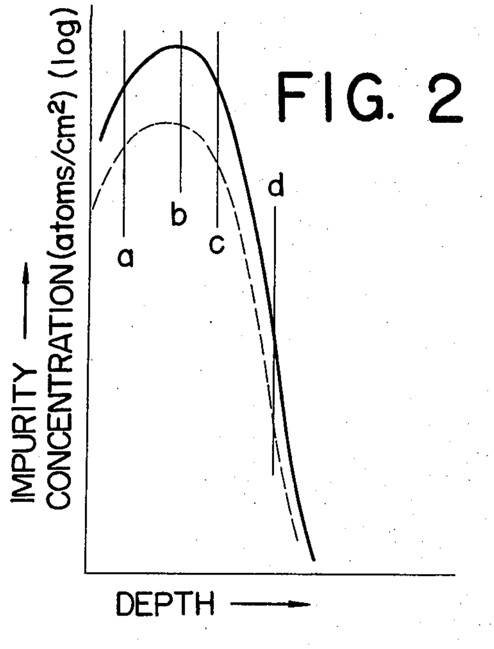
FIG. 2 is a plot representing the relationship between the distribution of impurity concentration and the thickness of the oxide film wherein the abscissa represents the depth from the substrate surface and the ordinate the impurity concentration in logarithm.
Figure 3A:
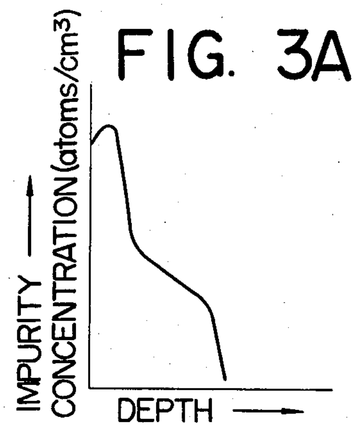
FIGS. 3A to 3F are curves to represent various types of the distribution of impurity concentration in which the co-ordinates have the same meaning as in FIG. 2.
Figure 3B:
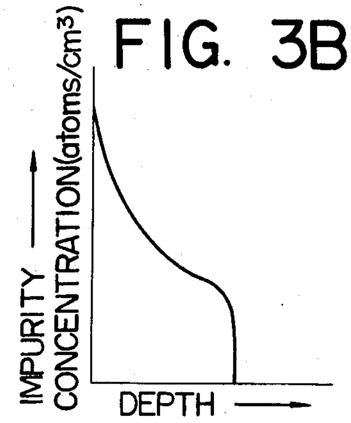
Figure 3C:
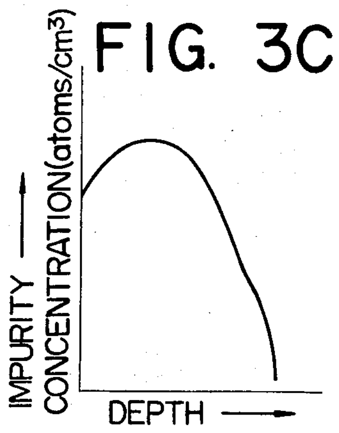
Figure 3D:
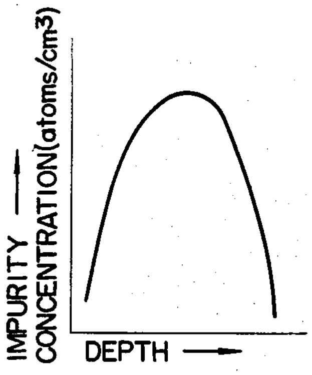
Figure 3E:
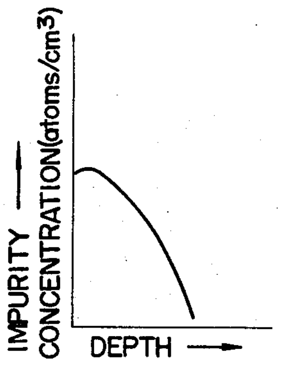
Figure 3F:
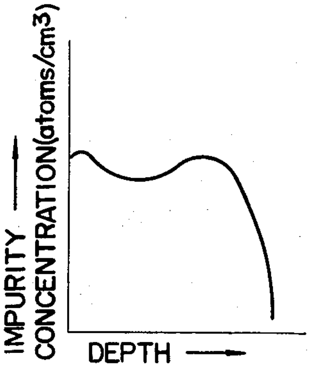

Typical distribution of the impurity concentration of the impurity layer thus formed is shown in FIG. 2 in which the abscissa represents the depth from the top surface of the semiconductor substrate and ordinate the concentration of the impurity. This distribution of the impurity concentration is controlled by such factors as the condition of implantation, the temperature and time of annealing, and the thickness of the oxide layer formed by the oxidizing atmosphere. Particularly, the depth of the junction can be controlled by the thickness of the oxide layer. Thus, for example, when the oxide layer is formed to a depth indicated by a line *a* shown in FIG. 2, the portion deeper than this depth comprises effectively the impurity layer. When it is desired to decrease the depth of the effective impurity layer oxide layer is to be terminated at lines *b*, *c*, or *d*. In this manner this invention makes it possible to control the distribution of the impurity concentration as well as the depth of the junction. Examples of such distribution are illustrated in FIGS. 3A to 3F in which the ordinate represents the concentration of the impurity while the abscissa the depth from the top surface of the substrate.

In this manner, according to this invention it is possible to diffuse the active impurity implanted into a semiconductor substrate by the ion-implantation method into deeper portions of the substrate thus controllably forming abrupt junctions in the substrate while maintaining the impurity distribution provided by the implanted impurity.

As the semiconductor substrate of this invention may be used silicon, germanium, gallium arsenide, gallium phosphide, and indium-antimony compound semiconductors. The term "active impurity" is used herein to designate any impurity that can form one conductivity type in the semiconductor substrate and includes ordinary impurities known in the art, for example, elements of Group III and V of the periodic table for silicon or germanium. The term junction herein used includes a PI-junction, NI-junction, $P^+P$-"junction" and $N^+N$-junction in addition to a PN-junction.

Above described temperature of annealing ranging from 900° C. to 1300° C. is selected on the ground that temperatures less than 900° C. do not result in any oxide layer in the impurity layer as well as sufficient diffusion of the impurity whereas temperatures above 1300° C. tend to impair the semiconductor substrate.

Aforementioned annealing carried out in an oxidizing atmosphere for at least one period of this annealing process means that all steps of annealing the semiconductor substrate may be entirely conducted in an oxidizing atmosphere, or the initial step may be conducted in the oxidizing atmosphere and the later step in a non-oxidizing atmosphere or vice versa.

For effective control of the diffusion or evaporation of implanted impurities, it is preferred that there be formed on oxide film at the initial stage of heating. In either case, the finally formed oxide film should be of such type as is capable of acting as a surface protective film. These conditions may be suitably selected dependent upon the required thickness of the oxide film to be formed. As the mask utilized in the ion-implantation method may be used a film of molybdenum or silicon nitride in addition to a film of silicon dioxide.

Since the destroyed layer produced by the ion-implantation process is occupied by the $SiO_2$ layer formed at the time of annealing, it is not necessary to eliminate the destroyed layer by any subsequent step. Said $SiO_2$ layer may also be employed in other steps, for example, as a mask, through the cutout part of which there is selectively drawn out an electrode. Since there is no need to be concerned about the generation of the aforesaid destroyed layer, there can be implanted impurities in high concentration.

EXAMPLE 1

Figure 4A:
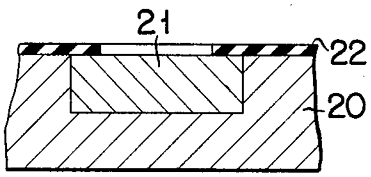
Figure 4B:
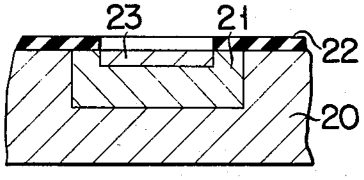
Figure 4C:
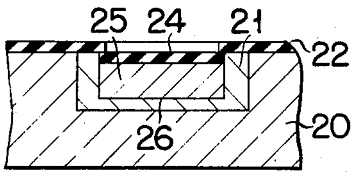

As a first embodiment of this invention, a method of fabricating an NPN-type transistor will be described hereunder with reference to FIGS. 4A to 4C.

Boron was diffused into an N-conductivity type silicon substrate 20 having a resistivity of 5 ohm-cm. by a conventional selective diffusion method to form a P-conductivity type base layer 21 having a concentration of $5\times10^{18}/cm.^3$. A portion of a silicon dioxide film 22 formed on the upper surface of the substrate at the time of diffusion was removed by a photoetching technique (FIG. 4A). Then phosphor, in the form of ions, was driven or implanted under an accelerating voltage of 10 kv. into the base layer 21 through the removed portion of the film 22 to form an N-conductivity type layer 23 having a concentration of $1\times10^{15}/cm.^3$ (FIG. 4B). Then the substrate 20 was annealed in an argon gas atmosphere containing 20 mol percent of dry oxygen at a temperature of 1050° C. for 10 minutes to form a silicon dioxide film 24 on the N-conductivity type layer 23 formed by the implantation of phosphor ions, and to cause the impurity to diffuse to form an N-conductivity type emitter layer 25 (FIG. 4C). Consequently, a PN-junction 26 was formed at a considerable depth from the top surface of the substrate. Electrodes were connected to the NPN-type transistor element thus obtained by a conventional method. The measured value of the current amplification factor according to the transistor described above was 50.

On the contrary, an NPN-type transistor fabricated by the prior method wherein a substrate formed with an N-conductivity type layer by the same phosphor implantation technique was annealed at 300° C. to 800° C. in argon atmosphere for 20 minutes had a current amplification factor of only 4 to 7.

EXAMPLE 2

An N-type silicon substrate having a resistivity of 1 ohm-cm. was prepared and boron was diffused into the substrate by the selective diffusion technique to form a P-conductivity type base layer having a concentration of $1\times10^{17}/cm.^3$. Then, by utilizing a mask of a silicon dioxide film, and under an acceleration voltage of 20 kv. antimony ions were implanted into the base layer to form an N-conductivity type emitter layer having a concentration of $1\times10^{14}/cm.^3$. Although such method of ion-implantation is not always essential, the so-called hot ion-implantation method may be used wherein the substrate is heated to a temperature ranging from 300° C. to 900° C. during the ion-implantation step. Then the substrate was annealed in an argon atmosphere containing 20 mol percent of dry oxygen at a temperature of 1050° C. for five minutes. Water was admitted into said atmosphere to prepare a wet oxygen-argon gas atmosphere and the substrate was further annealed in the latter atmosphere for three minutes to form a silicon dioxide film and an N-conductivity type emitter layer underlying the same in the same manner as in the previous example.

The NPN-type transistor thus fabricated had a current amplification factor of 40 and was suitable for use in a high frequency band of 2 gHz.

In contrast, an NPN-type transistor fabricated by a conventional method wherein antimony was implanted into the base layer by the ion-implantation method and the substrate was then annealed in vacuum at a temperature of 700° C. for 20 minutes had a current amplification factor of only 0.1. In addition, due to the small thickness of the emitter layer it was difficult to satisfactorily secure the emitter electrode.

EXAMPLE 3

Figure 5A:
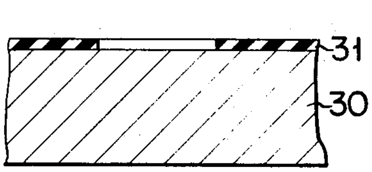
FIGS. 5A to 5C are sectional views similar to FIGS. 4A to 4C illustrating successive steps of fabricating a diode according to the method of this invention.
Figure 5B:
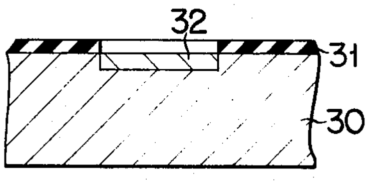
Figure 5C:
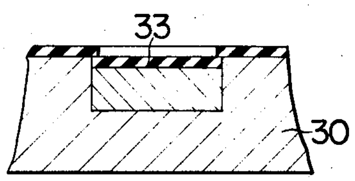

A method of fabricating a diode in accordance with the method of this invention will now be described with reference to FIGS. 5A to 5C.

An N-conductivity type silicon substrate 30 having a resistivity of 0.5 ohm-cm. was prepared and a silicon dioxide film 31 was formed on the surface thereof. A portion of film 31 was removed by photoetching technique to expose a portion of the substrate 30 (FIG. 5A). Aluminium ions were implanted into the exposed portion of the substrate 30 under an accelerating voltage of 20 kv. to form a P-conductivity type implanted layer 32 (FIG. 5B) having a thickness of about 2 microns. The substrate was then annealed in an argon gas atmosphere containing 10 mol percent dry oxygen at a temperature of 1100° C. for 10 minutes to form a silicon dioxide layer overlying the P-conductivity type layer and to diffuse aluminium to increase the depth of the P-conductivity type layer 32 (FIG. 5C).

The depth of a PN-junction 34 thus formed at the interface of the substrate 30 and the P-conductivity type layer 32 was 7 microns.

EXAMPLE 4

With reference now to FIGS. 6A to 6D, an $N^+$-conductivity type silicon monocrystalline substrate 40 was prepared and an N-conductivity type layer 41 having a resistivity of 1 ohm-cm. was formed on the surface of the substrate by the known epitaxial growth method. A P-conductivity type base layer 42 was formed in the surface layer portion of the N-conductivity type layer 41 by diffusion or by well known ion-implantation method, and the upper surface of the base layer 42 was covered by a silicon dioxide layer 43 (FIG. 6A). The silicon dioxide layer may be substituted by a metal film such as a molybdenum film. A suitable photoresist, for example KPR (trade name) was then applied to the upper surface of film 43 and an annular portion or two strip portions of film 43 was removed by photoetching technique to expose a portion or portions of the surface of the base layer 42. Then boron ions were implanted into the base layer 42 through this exposed portion or portions at room temperature by the ion-implantation method to form a $P^+$-conductivity type annular or implantation layer 44 or two strip layers (FIG. 6B). The ion-implantation was performed under conditions of an ion concentration of $1\times10^{15}/cm.^2$ and an acceleration voltage of 30 kv. The silicon dioxide layer 43 was then entirely removed from the base layer 42 and a new silicon dioxide film 45 was formed on the base layer 42 and the implanted layer 44. A portion of the film 45 located at a position surrounded by the layer 44 was removed by the same method as above described to expose a portion of the base layer 42 Arsenic was then implanted to this exposed portion at room temperature by the known ion-implantation method to form an N-conductivity type implanted layer 46 (FIG. 6C). Conditions of implantation were: the concentration of arsenic was $1\times10^{15}/cm.^2$ and the accelerating voltage was 30 kv. The substrate was then heated to diffuse the impurity contained in said layers 44 and 46 to form a $P^+$-conductivity type layer 47 having a deep PN-junction and an emitter layer 49 having an emitter-base junction (FIG. 6D). Although not shown in the drawing a base electrode is connected to the layer 47. The annealing process was conducted in two steps: the first step consisted of an annealing in an argon gas atmosphere at a temperature of 1100° C. for about 10 minutes while the second step consisted of an annealing in an argon atmosphere containing 5% of dry oxygen at a temperature of 1150° C. for about 60 minutes. As can be noted from FIG. 6D, since the diffusion coefficient of boron is larger than that of arsenic, the implanted layer 44 containing boron diffuses deeper than the implanted layer 46 containing arsenic under the same condition of annealing whereby a graft base construction will result. A silicon dioxide film 48 was also formed on the surface of the emitter layer by said annealing process. This film was then completely or partially removed. Then an emitter electrode (not shown) was attached to layer 49 by a well known method and a base electrode (not shown) to the upper portion of the $P^+$-conductivity type layer 47 exposed by removing the overlying oxide film to obtain a transistor.

While in the above described embodiment, boron ions were implanted first and then arsenic ions, the order of implantation may be reversed.

Above described example of this invention has following advantages.

(1) It is possible to make small the width of the base layer, thus enabling to decrease the resistivity of the portion of the base layer immediately beneath the emitter.

(2) The base layer and emitter layer can be formed simultaneously by one heat treatment. In addition to these advantages, in the transistor of the graft base type there are following advantages.

(3) It is possible to decrease the effective capacitance per unit area.

(4) It is possible to decrease the layer resistance of the external base region.

(5) It is possible to decrease the electrode contact resistance at the emitter region and base contact region.

For this reason, it is possible to provide transistors of improved high frequency characteristics.

EXAMPLE 5

Figure 7A:
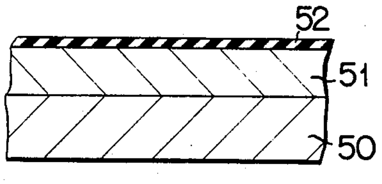
Figure 7B:
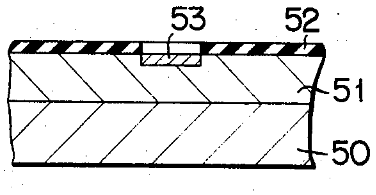
Figure 7C:
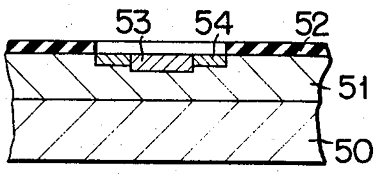
Figure 7D:
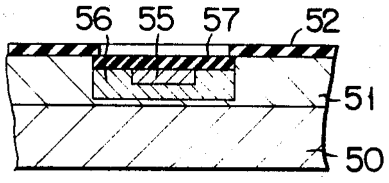

Turning now to FIGS. 7A to 7D, an $N^+$-conductivity type silicon substrate 50 was prepared, and an N-conductivity type collector layer 51 was formed on the upper surface of the substrate by the epitaxial growth method. A silicon dioxide film 52 was formed on the collector layer 51 in a high temperature oxidizing atmosphere by the oxidation growth method (FIG. 7A). Alternatively a silicon nitride ($Si_3N_4$) film may be used formed by the pyrolysis decomposition of a mixture of silanes and ammonia effected at low temperatures. A portion of this film was then removed to expose a portion of said N-conductivity type collector layer 51. Ions of an N-type impurity, arsenic and phosphor for example, were implanted into the exposed region under an accelerating voltage of 30 kv. to form a first implanted layer 53 (FIG. 7B). The exposed region of the substrate formed by removing a portion of silicon dioxide film 52 was enlarged and a P-type impurity, boron and gallium for example, was implanted into the substrate at the enlarged portion to form a second implanted layer 54 surrounding the first implanted layer 53 (FIG. 7C). Finally, the substrate 50 was annealed in an oxidizing atmosphere at a temperature of 1100° C. for 15 minutes to diffuse the impurities contained in the first and second layers 53 and 54 to form an emitter layer 55 and a base layer 56 (FIG. 7D). The N-conductivity type impurity utilized to form the emitter layer should have smaller diffusion coefficient than the P-conductivity type impurity utilized to form the base layer. Similar to the previous embodiments a silicon dioxide film 57 was formed to overlay the emitter layer 55 and the base layer 56.

Although in the above embodiment, a P-type impurity was used to form the base layer and an N-type impurity was used to form the emitter layer it will be obvious to one skilled in the art that the conductivity type of the impurity should be reversed when the collector layer is of the P-conductivity type. Further, it will be clear that the order of forming the implanted layer for the emitter layer (first implanted layer) and the implanted layer for forming the base layer (second implanted layer) may be reversed.

According to the invention, annealing was carried out at a temperature ranging from 900° C. to 1300° C. immediately after the ion-implantation. However, there may be annealed a semiconductor substrate by the ordinary process, namely, at a temperature of from 300° C. to 800° C.

What we claim is:

1. A method of manufacturing a semiconductor device comprising the sequential steps of:

forming at least one implanted layer in a semiconductor substrate having at least a portion of its surface exposed by implanting ions of an active impurity thereinto; and then annealing said substrate within the temperature range of 900° C. to 1300° C., and subjecting said substrate to an oxidizing atmosphere during at least one period of said annealing process to diffuse the impurity which forms said implanted layer further into the substrate and forming an oxide layer on said implant layer and on said exposed surface.

2. A method according to claim 1 wherein said active impurity is implanted into said substrate while said substrate is heated to a temperature of 300° C. to 900° C.

3. A method according to claim 2 wherein said active impurity is implanted into said substrate by the ion-implantation method under a relatively low accelerating voltage.

4. A method according to claim 1 wherein one period of said annealing process is carried out in an inert atmosphere.

5. A method according to claim 1 wherein said substrate has one conductivity type and said impurity is of the other conductivity type.

6. A method according to claim 1 wherein said substrate and said impurity have the same conductivity type.

7. A method according to claim 6 which further comprises the steps of forming in said semiconductor substrate a first layer having a conductivity type opposite to that of said substrate, a portion of said first layer being exposed at one surface of said semiconductor substrate, and covering the surface of said substrate including said exposed surface with a film of oxide which selectively prevents implantation of ions of the active impurity, and in which said implantation process includes implanting a second impurity having different conductivity type as said first layer into said exposed first layer to form a second layer.

8. A method according to claim 1 wherein impurities of different conductivity type are implanted into said substrate to form a plurality of implanted layers of different type in said substrate.

9. A method according to claim 8 wherein the implantation process consists of two steps, the first including implanting a first impurity in a selected portion of the surface of the semiconductor substrate of one conductivity type to form a first implanted layer, the second including implanting a second impurity into the surface of said substrate to form a second implanted layer, said first and second layers at least partially overlapping, said first and second impurities having different conductivity type and different diffusing speed in said substrate, and said annealing process includes annealing said substrate formed with said first and second layers at a temperature ranging from 900° C. to 1300° C. whereby to cause one impurity having a conductivity type opposite to that of said semiconductor substrate to diffuse into deeper portions thereof to form a base layer and to cause the other impurity having the same conductivity type as said semiconductor substrate to diffuse into shallower portions thereof to form an emitter layer.

10. A method of manufacturing a semiconductor device which comprises the steps of forming in a semiconductor substrate of one conductivity type a first base layer of the opposite conductivity type, implanting a first impurity having a conductivity type opposite to that of said first base layer into a predetermined portion of the base layer to form a first implanted layer therein, implanting a second impurity having different conductivity type and faster diffusion speed than said first impurity into said first base layer at a portion discrete from said first implanted layer to form a second implanted layer, and annealing said semiconductor substrate formed with said first and second implanted layers within the temperature range of 900° C. to 1300° C. to cause the impurity in said first impurity layer to diffuse to shallower portions and to cause the impurity in said second implanted layer to diffuse to deeper portions of said first base layer to form an emitter layer and a second base layer, respectively, said second base layer having higher impurity concentration, and form oxide layers on said first and second implanted layers respectively, said substrate being exposed to an oxidizing atmosphere during at least one period of said annealing process.

11. A method of manufacturing a semiconductor device comprising the steps of implanting ions of an active impurity into a selected portion of the surface of a semiconductor substrate to form at least one implanted layer, annealing said substrate at a temperature ranging from 300° C. to 900° C., and further annealing said substrate at a temperature ranging from 900° C. to 1300° C., at least one period of the further annealing step being performed in an oxidizing atmosphere to form an oxide layer on the surface of the impurity implanted layer of said substrate and to diffuse the impurity formed in said layer into the substrate.

12. A method according to claim 11 wherein said oxidizing atmosphere is an argon atmosphere containing oxygen.

13. A method according to claim 11 wherein in said semiconductor substrate is formed a first layer of a different conductivity type from said substrate, a portion of said first layer being exposed to one surface of said semiconductor substrate and ions of the active impurity having a conductivity type as said first layer is implanted into said first layer through said exposed surface to form a second layer therein.

References Cited

UNITED STATES PATENTS

| | | | |
|---|---|---|---|
| 3,390,019 | 6/1968 | Manchester | 148—1.5 |
| 3,484,309 | 12/1969 | Gilbert | 148—187 |
| 3,523,042 | 8/1970 | Bower et al. | 148—1.5 |
| 3,558,366 | 1/1971 | Lepselter | 148—1.5 |
| 3,653,978 | 4/1972 | Robinson et al. | 148—1.5 |

L. DEWAYNE RUTLEDGE, Primary Examiner

J. M. DAVIS, Assistant Examiner

U.S. Cl. X.R.

148—187, 190; 317—235 R